(12) United States Patent
Ueda et al.

(10) Patent No.: US 7,196,441 B2
(45) Date of Patent: Mar. 27, 2007

(54) AC GENERATOR FOR VEHICLES

(75) Inventors: Kenji Ueda, Nagoya (JP); Motoki Ito, Oobu (JP)

(73) Assignee: Denso Corporation, Kariya (JP)

( * ) Notice: Subject to any disclaimer, the term of this patent is extended or adjusted under 35 U.S.C. 154(b) by 114 days.

(21) Appl. No.: 10/802,931

(22) Filed: Mar. 18, 2004

(65) Prior Publication Data

US 2004/0256924 A1 Dec. 23, 2004

(30) Foreign Application Priority Data

| Mar. 18, 2003 | (JP) | ............................... 2003-073182 |
| Mar. 18, 2003 | (JP) | ............................... 2003-073184 |

(51) Int. Cl.
| *H02K 1/32* | (2006.01) |
| *H02K 3/24* | (2006.01) |
| *H02K 5/18* | (2006.01) |
| *H02K 9/00* | (2006.01) |

(52) U.S. Cl. ..................... 310/64; 310/68 R; 310/68 D
(58) Field of Classification Search .................. 310/64, 310/68 R, 68 D
See application file for complete search history.

(56) References Cited

U.S. PATENT DOCUMENTS

| 3,198,972 | A | * | 8/1965 | Larson ...................... 310/68 R |
| 3,573,516 | A | | 4/1971 | Lyon et al. |
| 3,629,630 | A | | 12/1971 | Hollywood |
| 3,925,809 | A | | 12/1975 | Striker |
| 4,321,664 | A | * | 3/1982 | Matthai ...................... 363/144 |
| 5,473,208 | A | * | 12/1995 | Stihi ........................ 310/68 D |
| 5,729,063 | A | | 3/1998 | Adachi et al. |
| 5,949,166 | A | | 9/1999 | Ooiwa et al. |
| 6,184,602 | B1 | | 2/2001 | Ooiwa et al. |
| 6,307,289 | B1 | | 10/2001 | Skala |
| 6,429,556 | B1 | | 8/2002 | Nakamura et al. |
| 6,540,062 | B2 | * | 4/2003 | Wunscher et al. .......... 198/395 |
| 6,828,703 | B2 | * | 12/2004 | Einheuser et al. ........ 310/68 D |
| 2003/0042808 | A1 | | 3/2003 | Keidar et al. |
| 2004/0051409 | A1 | * | 3/2004 | Nakamura et al. ........ 310/68 D |
| 2004/0256925 | A1 | * | 12/2004 | Morrissette et al. ...... 310/68 B |

FOREIGN PATENT DOCUMENTS

| DE | 198 28 518 A1 | 12/1999 |
| FR | 2 752 109 A1 | 2/1998 |
| FR | 2 824 966 | 11/2002 |
| GB | 1 317 266 | 5/1973 |
| JP | 50-33417 | 3/1975 |

(Continued)

*Primary Examiner*—Burton S. Mullins
*Assistant Examiner*—Erik Preston
(74) *Attorney, Agent, or Firm*—Oliff & Berridge, PLC

(57) ABSTRACT

The present invention provides an AC generator for a vehicle, capable of improving the cooling capability and environmental resistance of a rectifier. The rectifier of the vehicle AC generator includes a positive electrode side radiating fin and negative electrode side radiating fin disposed in piles in a axial direction, a positive electrode side rectifying elements and negative electrode side rectifying elements provided in the radiating fins, respectively, and a terminal board. The positive electrode side radiating fin is equipped with cylindrical fixing portions to which the positive electrode side rectifying elements are fixed and radial sub-fins extending radially from the fixing portions. An opening portion surrounded by the fixing portion, the radial sub-fin and others forms an axial air flow passage.

5 Claims, 10 Drawing Sheets

FOREIGN PATENT DOCUMENTS

| | | |
|---|---|---|
| JP | A 51-30646 | 9/1976 |
| JP | U 56-63282 | 5/1981 |
| JP | A 8-182279 | 7/1996 |
| JP | A 10-56760 | 2/1998 |
| JP | A 10-56762 | 2/1998 |
| JP | A 11-164538 | 6/1999 |
| JP | A 2000-350426 | 12/2000 |
| JP | 1 162 719 A2 | 12/2001 |
| JP | A 2001-352715 | 12/2001 |
| JP | A 2004-511197 | 4/2004 |
| WO | WO 02/29958 A1 | 4/2002 |
| WO | WO 02/093717 A1 | 11/2002 |

* cited by examiner

AC GENERATOR FOR VEHICLES

BACKGROUND OF THE INVENTION

1) Field of the Invention

The present invention relates to a vehicle AC generator (alternator) to be mounted in a car or truck.

2) Description of the Related Art

In the recent years, for the requirements of slant nose for reduction of vehicle traveling resistance and of accommodation space assurance in the interior of a vehicle, the tend is toward narrowing down the engine room, which tightens the mounting space of a vehicle AC generator and, at the same time, raises the temperature in the engine room. Moreover, although the engine speed is made to decrease, for example, during idling for the improvement of fuel efficiency and, hence, the speed of rotation of the vehicle AC generator also decreases, an increase in electrical load due to the employment of security control units and the like requires the enhancement of power generation ability. For these requirements to reach satisfaction, the heat generation in various types of parts constituting the vehicle AC generator increases. In particular, this creates a problem of raising the temperature of a rectifying element of a rectifier for the conversion of an alternating-current voltage from a stator into a direct-current voltage. For this reason, there is a need to efficiently cooling a radiating fin of the rectifier in a limited space.

In addition, along with the slant nose formation, there is a high possibility that water or foreign materials jumping up from tires stick to the vehicle AC generator. In particular, in a cold district, salt water serving as an electrolyte flies due to snow melting salt, which creates a problem in that there is a possibility of the corrosion of current-carrying parts. Therefore, the improvement of environmental resistance is eagerly expected. Still additionally, also in the case of the car shampoo cleaning for the interior of the engine room, the car shampoo serves as an electrolyte and, hence, it causes the corrosion of the current-carrying parts. Likewise, the improvement of environmental resistance is eagerly expected.

So far, there has been known a vehicle AC generator (for example, see French Patent Laid-Open No. 2752109 (Pages 3–7, FIGS. 1–3) in which a fringe-like axial radiating fin is provided on a rear side of a rectifying element of a rectifier to transfer the generated heat of the rectifying element directly to the radiating fin for enhancing the cooling capability or a vehicle AC generator (for example, Japanese Patent Laid-Open No. HEI 10-56762 (Pages 3–5, FIGS. 1–7) in which a fin extending radially from the center of a rectifying element is provided on a surface of a radiating fin to efficiently transmit the heat generated by the rectifying element for enhancing the cooling capability. Moreover, there has been known a vehicle AC generator (for example, U.S. Pat. No. 6,307,289 (Pages 5–6, FIGS. 1–3) in which radiating fins am provided in piles in an axial direction and a large through-hole is made radially at a position separated from a drive hole of a rectifying element so that cooling wind from the external is directly introduced into this through hole to reduce the air flow resistance for improving the cooling performance.

Meanwhile, there is a need to provide a higher output, for that a new heater is mounted to cope with the recent shortage of heat source stemming from the improvement of efficiency of vehicle-mounted equipment and a purifier is provided to purify the exhaust gas. However, the cooling structure of the rectifier of the vehicle AC generator disclosed in French Patent Laid-Open No. 2752109 or in Japanese Patent Laid-Open No. HEI 10-56762 is superior in thermal conductivity in the interior of the radiating fin, but it does not have a sufficient cooling capability because of small cooling air quantity. If the output current is increased without changing the structure, there is a possibility that the temperature rises accordingly to exceed an allowable temperature range. On the other hand, it can be considered to increase the size of the radiating fin for enlarging the radiating area, or to increase the diameter of the cooling wind generating cooling fan for increasing the cooling wind quantity. However, these structures are against the recent size-reduction tendency, so difficulty is encountered in employing these structures. Moreover, no consideration is given to the improvement of environmental resistance against the flying of electrolyte.

In addition, although the vehicle AC generator disclosed in U.S. Pat. No. 6,307,289 can secure the cooling wind quantity because the cooling wind is introduced through the large through-hole, since the distance from the rectifying element acting as a heat generating portion to the through-hole is long and the opening area of the through-hole is large, the heat transfer efficiency of the radiating fin is poor so that difficulty is experienced in securing a sufficient cooling capability with respect to the output enhancement.

Furthermore, as a rectifier employed in a conventional vehicle AC generator, there has been known a device made from a given thickness, such as being made by means of aluminum die-casting (for example, German Patent Laid-Open No. 19828518). In this rectifier, a negative electrode side radiating fin and a rectifying element attached thereto are brought into direct contact with a rear frame and cooling wind is made to pass through an inner circumferential side of a positive electrode side radiating fin, thus accomplishing the cooling on negative electrode side and positive electrode side rectifying elements.

However, likewise, the rectifier of the vehicle AC generator disclosed in German Patent Laid-Open No. 19828518 does not have a sufficient cooling capability, and if the output current is increased without changing the structure, there is a possibility that the temperature rises accordingly to exceed an allowable temperature range. In addition, since a plate-like member is employed for a radiating fin of the rectifier of the vehicle AC generator disclosed in German Patent Laid-Open No. 19828518, vibrations easily occur to generate abnormal sounds.

SUMMARY OF THE INVENTION

The present invention has been developed with a view to eliminating the above-mentioned problems, and it is therefore an object of the invention to provide an AC generator for a vehicle, capable of enhancing the cooling capability and vibration resistance of a rectifier.

For this purpose, in accordance with an aspect of the present invention, there is provided an AC generator for a vehicle, comprising a rotor, a stator disposed in opposed relation to the rotor, a frame for supporting the rotor and the stator, a rectifier fixedly secured to the frame and equipped with a radiating fin which cools a rectifying element and makes an electrical connection thereto, and a cooling wind generating device for sucking cooling wind through the rectifier into the rotor side, wherein the radiating fin includes a fixing portion to which the rectifying element is fixedly secured and a sub-fin extending radially from the fixing portion, and has an opening portion surrounded by the fixing portion, the sub-fin and an outer circumferential end portion of the radiating fin.

Thus, since the sub-fin is formed to extend radially from the fixing portion for the rectifying element, the heat generated by the rectifying element can be efficiently transmitted through the sub-fin without staying in the vicinity of the rectifying element, and since the cooling wind passes through the opening portion surrounded by the fixing portion and the sub-fin, the cooling wind can directly cool the fixing portion and the sub-fin, which becomes high in temperature which can improve the cooling capability on the rectifier. Moreover, since the opening portion is formed around the fixing portion for fixing the rectifying element, the vibration becomes hard to transfer from a portion around the radiating fin to the fixing portion, which enables reducing the possibility of the disconnection of a lead portion of the rectifying element.

In addition, preferably, the thickness of the aforesaid fixing portion in a radial direction is smaller than the thickness of the sub-fin along the axis of the rectifying element. This enables the outer circumferential portion of the fixing portion which is in the vicinity of the rectifying element serving as a heat generating portion and which is high in temperature to be efficiently cooled by the cooling wind.

Still additionally, preferably, a cooling wind suction side end portion of the aforesaid sub-fin further protrudes toward the cooling wind suction side with respect to a cooling wind suction side end portion of the fixing portion or a cooling wind suction side end portion of the rectifying element fixed to the fixing portion. This enables the cooling wind hitting the rectifying element can smoothly be introduced into the opening portion, and if the axial length of the sub-fin is prolonged to enhance the radiating area and the heat capacity, the cooling capability is further improvable.

Yet additionally, preferably, the aforesaid sub-fin has a first wall surface disposed on an outer-diameter side around the rectifying element and a second wall surface disposed on an inner-diameter side to make an angle below 180 degrees with respect to the first wall surface. This enables securing air flow passages in the vicinity of two sub-fin inner-diameter end portions. In particular, it is possible to efficiently cool the vicinity of the inner-diameter end portions whose temperature becomes high, and further to increase the quantity of the cooling wind flowing into the opening portion.

Moreover, preferably, the aforesaid radiating fin is made of aluminum in a die-casting manner. This enables the improvement of the quantity production, which leads to the cost reduction.

Still moreover, preferably, a standing portion protruding toward the cooling wind suction side with respect to the cooling wind suction side end portion of the fixing portion is formed on an inner-circumferential end portion of the radiating fin. Thus, the cooling wind sucked into the vicinity of the center of the radiating fin can be led to the vicinity of the rectifying element acting as a heat generating portion, thereby achieving the efficient cooling. In a case in which there is a difference in temperature along a circumferential direction of the radiating fin, for example, if, in a positive electrode side radiating fin, the temperature of an end portion on the side separated from an output terminal becomes high, the heat is transmitted though the standing portion to uniformize the temperature distribution along a circumferential direction of the radiating fin.

Furthermore, preferably, the aforesaid radiating fin includes, as two types of radiating fins, a positive electrode side radiating fin and a negative electrode side radiating fin disposed in piles in a direction of a rotary shaft of the rotor, and a lead portion of the rectifying element fixedly secured to one radiating fin is directed at the other radiating fin side and a cooling wind suction side end surface position of the other cooling fin is set on the upstream side along a flow of the cooling wind with respect to a lead portion joint position. In the case of the vehicle AC generator, in most cases, the rotary shaft of its rotor is mounted in a vehicle to be placed into a horizontal condition and, in this case, even if, due to the reception of water, an electrolyte or the like flows through the other radiating fin, it is possible to prevent the electrolyte from directly reaching the lead portion of the rectifying element fixedly secured to one radiating fin. This can reduce the occurrence of corrosion stemming from the electrolyte and can improve the environmental resistance. Moreover, since it is possible to eliminate the need for the employment of a waterwall needed for preventing the electrolyte from directly reaching the lead portion, which achieves cost reduction through the structural simplification.

Still furthermore, preferably, the aforesaid radiating fin includes, as two types of radiating fin, a positive electrode side radiating fin and a negative electrode side radiating fin disposed in piles in a direction of a rotary shaft of the rotor, and a sub-fin and an opening portion are made in at least one radiating fin located on the upstream side along the flow of the cooling wind and a plurality of protruding portions are formed at a position on the other radiating fin corresponding to the opening portion. Thus, the cooling wind passing through the opening portion of one radiating fin can be applied to the protruding portions of the other radiating fin, which achieves the efficient cooling on the other radiating fin and improves the cooling capability of the entire rectifier.

Yet furthermore, preferably, the above-mentioned plurality of protruding portions are formed radially around the rotary shaft of the rotor. Thus, the cooling wind arriving at the other radiating fin can smoothly be supplied to its inner-diameter side or its outer-diameter side, thereby improving the cooling capability owing to the reduction of the air flow resistance.

In addition, preferably, the thickness of the sub-fin corresponding to the aforesaid rectifying element, along the axis of the rectifying element, is made irregularly. That is, this can change the radiating area according to a temperature distribution of the rectifying element, thereby uniformizing the temperature of the rectifying element.

Still additionally, preferably, an output terminal is provided at one end portion along a circumferential direction of the aforesaid radiating fin and, for the sub-fin corresponding to the reifying element disposed on the other end side along the circumferential direction, the thickness along the axis of the rectifying element is larger than the thickness the sub-fin corresponding to the other rectifying element. In general, the temperature of one end side of the radiating fin at which the output terminal exists becomes lower than the other end side temperature because the heat is transmitted to the output terminal. Therefore, the axial thickness of the sub-fin provided on the other end side where the temperature is high is set to be larger to lower the temperature, which enables the uneven circumferential-direction temperature distribution of the radiating fin to be brought close to an even condition, thus enhancing the cooling capability of the entire radiating fin.

Furthermore, in accordance with a further aspect of the present invention, there is provided an AC generator for a vehicle, comprising a rotor, a stator disposed in opposed relation to the rotor, a frame for supporting the rotor and the stator, a rectifier fixedly secured to the frame and equipped with a radiating fin which cools a rectifying element and makes an electrical connection thereto, and a cooling wind generating device for sucking cooling wind through the rectifier into the rotor side wherein the radiating fin includes a fixing portion to which the rectifying element is fixedly secured and a first sub-fin extending radially from the fixing portion and a second sub-fin made to divide an opening portion surrounded by the fixing portion, the first sub-fin and an outer circumferential end portion of the radiating fin. Accordingly, the cooling wind can directly be applied to the fixing portion for the rectifying element which is close to a heat generating portion, thus making the heat radiation. In addition, the second sub-fin is used as a reinforcing member so as to cross the opening portion made in the vicinity of the fixing portion, which improves the vibration proof of the radiating fin.

In addition, preferably, at least one side surface forming the opening portion is made to be inclined to reduce the opening area along a flow of cooling wind to be sucked. This enables enlarging the area of the inner wall surface of the opening portion, thus improving the cooling capability through the enlargement of the heat radiating area. Moreover, because of the gradual reduction of the opening area, the flow velocity of the cooling wind increases gradually when the cooling wind passes through the interior of the opening portion, which can enhance the efficiency of the heat radiation (dissipation) from the inner wall surface of the opening portion.

Still additionally, preferably, the aforesaid second sub-fin has an arc-like configuration formed concentrically with the axis of the rectifying element. This enables two adjacent first sub-fins to be connected to each other through the use of the second sub-fin, which improves the vibration resistance, and since the second sub-fin is placed in the cooling wind passage, the radiating area increases, which enhances the cooling capability.

Yet additionally, preferably, the aforesaid second sub-fin is located on a more outer diameter side with respect to the fixed position of the rectifying element around the rotary shaft of the rotor. That is, as compared with a case of being formed on an inner diameter side, the radiating area becomes enlargeable.

Moreover, preferably, the length of the second sub-fin along a direction of the rotary shaft of the rotor is set to be shorter than length of the first sub-fin in the rotary shaft direction and a cooling wind suction side end portion thereof is located on the cooling wind generating device side with respect to the suction side end portion of the first sub-fin. Therefore, the second sub-fin(s) can be formed without decreasing the cooling wind suction side opening area, which improves the cooling capability and the vibration resistance.

Still moreover, the aforesaid radiating fin includes, as two types of radiating fins, a positive electrode side radiating fin and a negative electrode side radiating fin which are disposed in piles in a direction of the rotary shaft of the rotor, and at least the radiating fin disposed on the upstream side along a flow of the cooling wind has the first and second sub-fins. Thus, the air flow resistance becomes reducible owing to the radiating fin disposed on the upstream side along the flow of the cooling wind, which enables efficiently cooling the radiating fin disposed on the downstream side, and which further improves the cooling capability of the entire rectifier.

BRIEF DESCRIPTION OF THE DRAWINGS

Other objects and features of the present invention will become more readily apparent from the following detailed description of the preferred embodiments taken in conjunction with the accompanying drawings in which.

DESCRIPTION OF THE PREFERRED EMBODIMENTS

Figure 1:
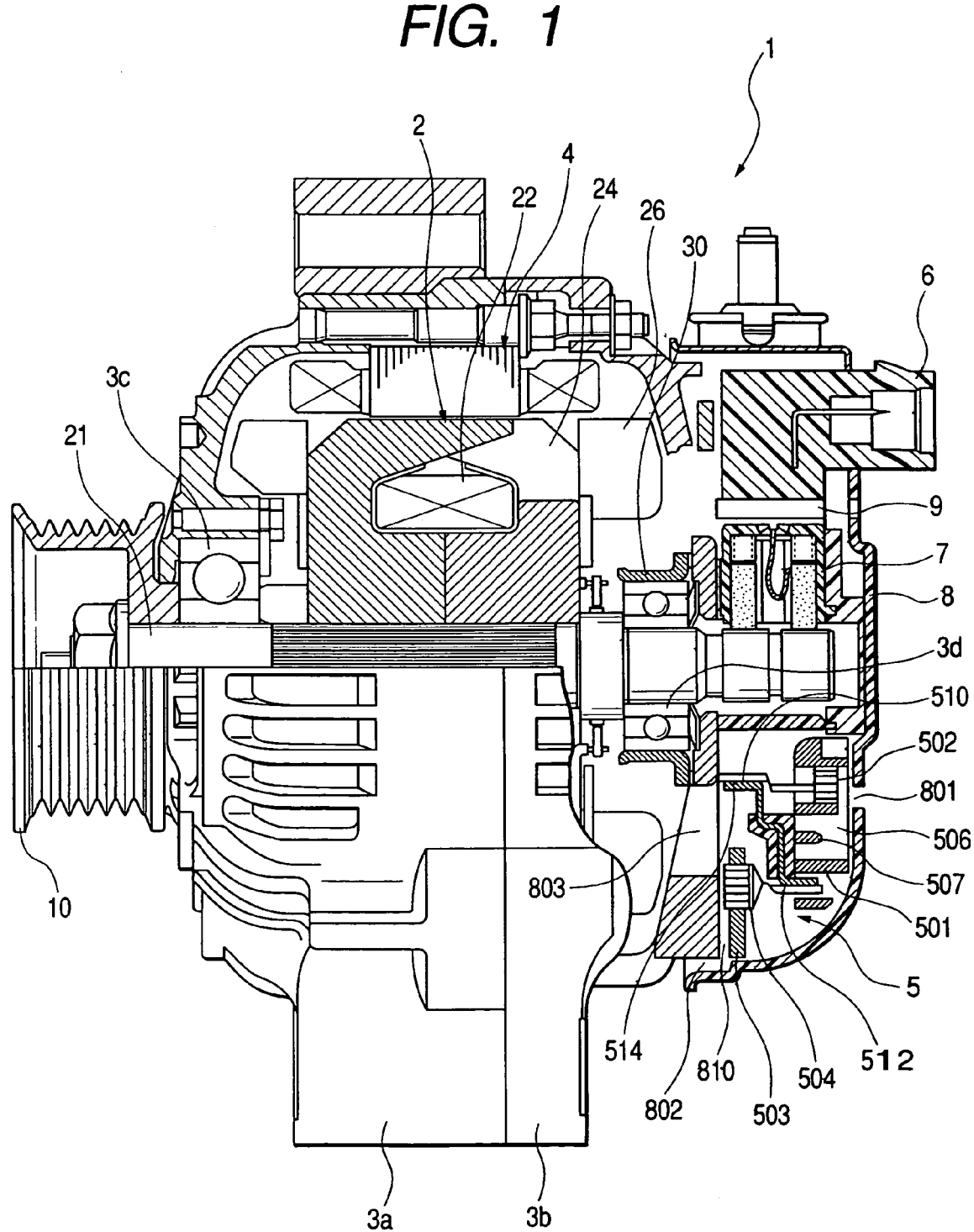
FIG. 1 is a cross-sectional view showing an AC generator for use in a vehicle according to an embodiment of the present invention.

Embodiments of the present invention will be described hereinbelow with reference to the drawings.

Referring to the drawings, a detailed description will be given hereinbelow of an AC generator for use in a vehicle according to an embodiment of the present invention.

FIG. 1 is a cross-sectional view showing the vehicle AC generator according to this embodiment.

As FIG. 1 shows, the vehicle AC generator according to this embodiment, generally designated at reference numeral 1, is made up of a rotor 2 rotationally driven by the vehicle engine through a belt (not shown) and a pulley 10, a stator 4 serving as an armature, a front frame 3a and a rear frame 3b for supporting the rotor 2 and the stator 4 through a pair of bearings 3c and 3d, a rectifier 5 connected to the stator 4 for converting an alternating-current output into a direct-current output, a brush device 7 holding a brush for supplying a magnetic-field current to a magnetic-field coil 22 of the rotor 2, a regulator 9 for controlling an output voltage, a connector case 6 having terminals for input/output of electric signals with respect to the vehicle, a resin-made protective cover 8 set on an end surface of the rear frame 3b for covering the rectifier 5, the regulator 9 and the brush device 7, and others.

The rotor 2 includes, at an axial end surface of a rotor magnetic pole 24, a cooling fan 26 functioning as a cooling wind generating device for sucking (taking in) cooling wind from the external through the rectifier 5.

Figure 2:
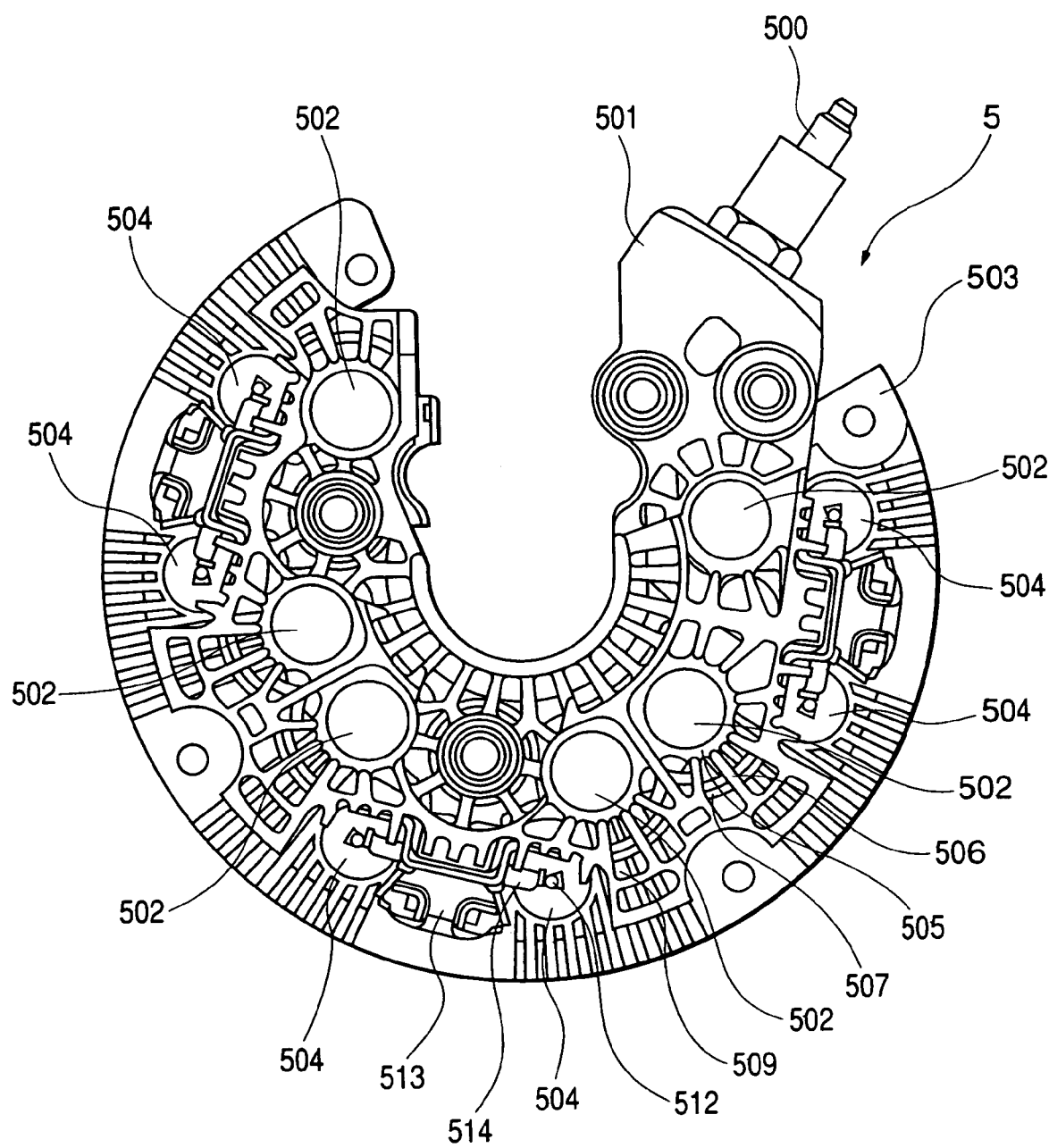
FIG. 2 is a plan view showing a rectifier according to the embodiment.
Figure 3:
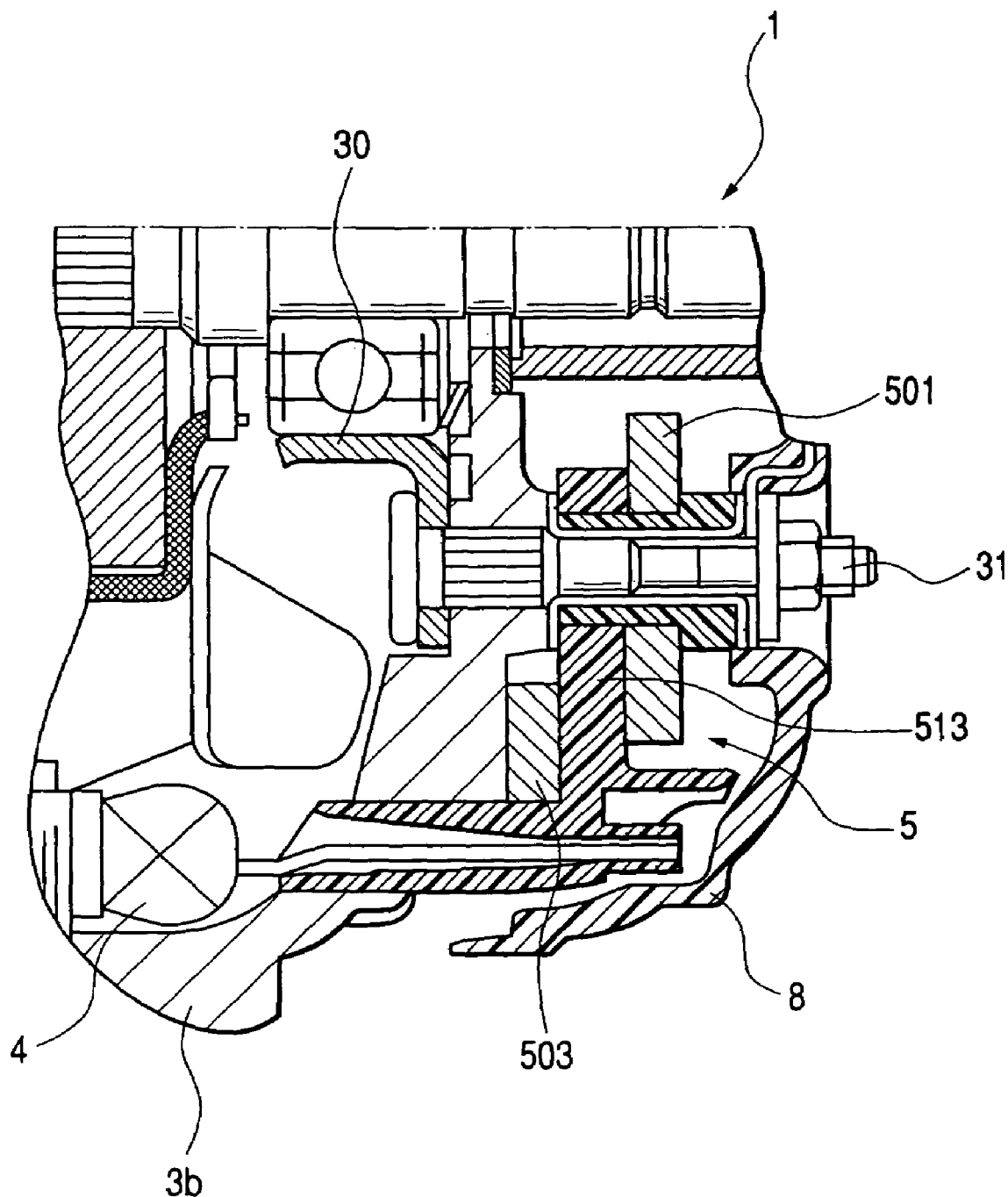
FIG. 3 is a partial cross-sectional illustration of the vehicle AC generator, showing a cross-sectional construction of the rectifier according to the embodiment.
Figure 4:
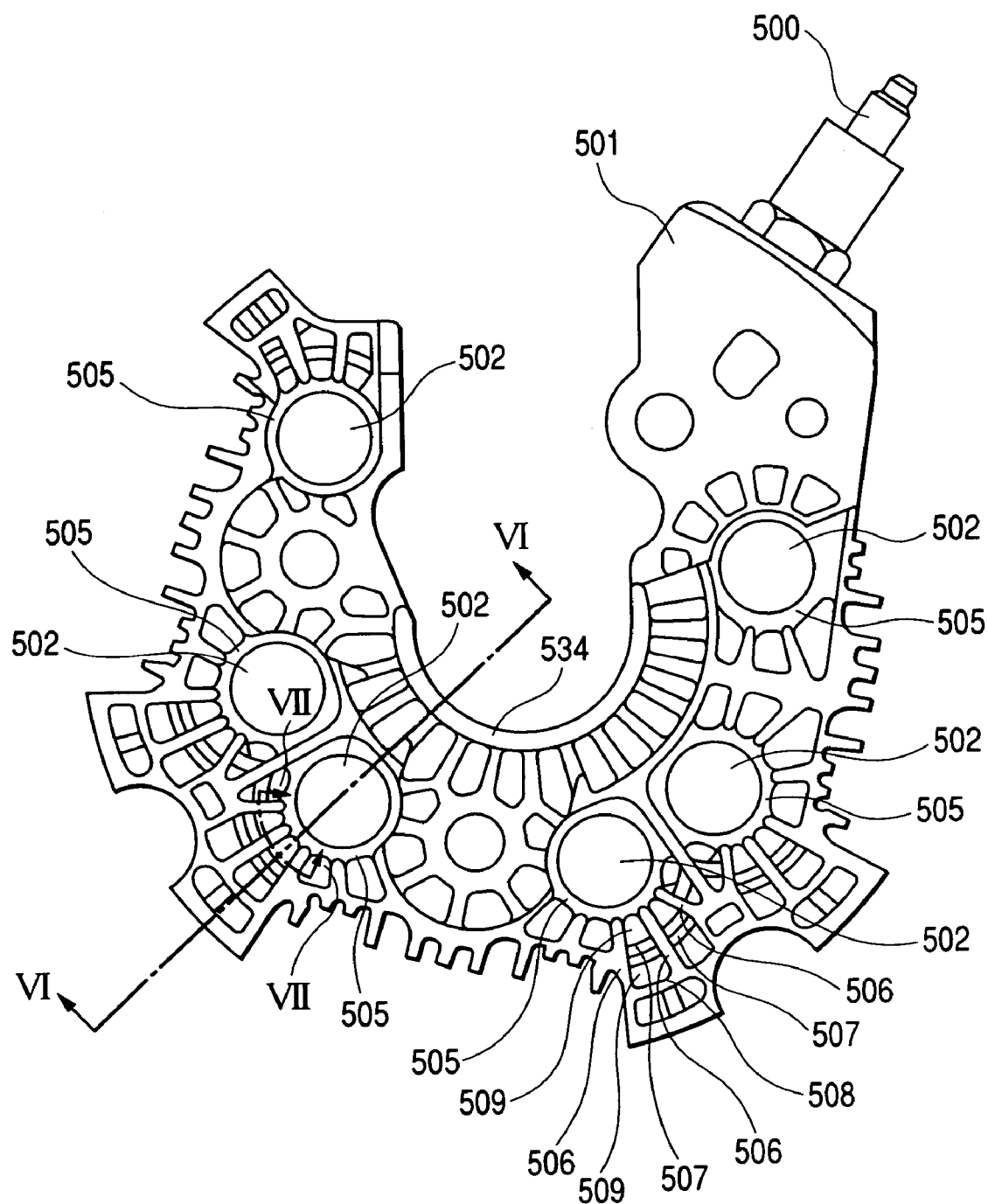
FIG. 4 is a plan view showing a positive electrode side radiating fin included in the rectifier according to the embodiment.
Figure 5:
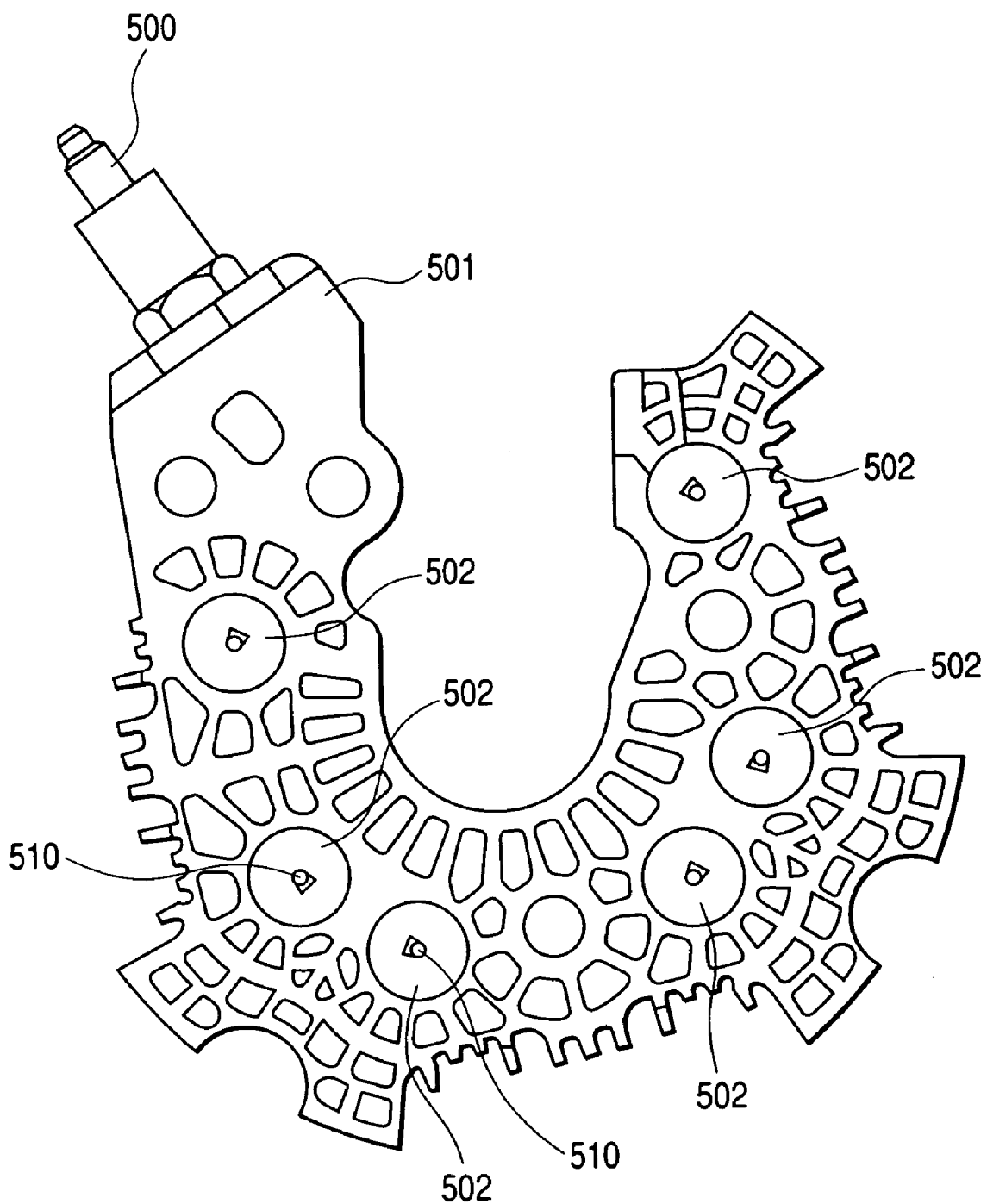
FIG. 5 is a bottom view showing the positive electrode side radiating fin according to the embodiment.
Figure 7:
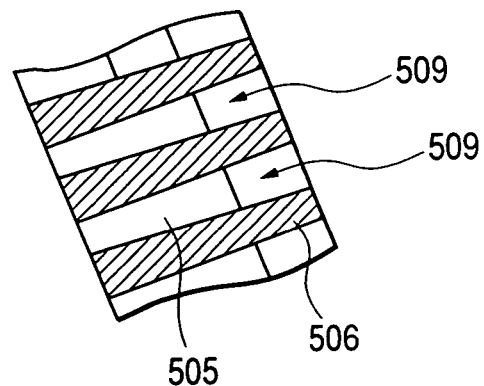
FIG. 7 is a enlarged cross-sectional view taken along a line VII—VII in FIG. 4.
Figure 8:
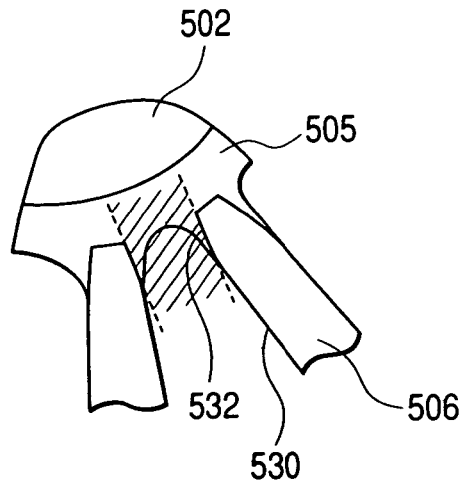
FIG. 8 is an enlarged view partially showing a fixing portion for a radiating fin and radial sub-fin of FIG. 4.
Figure 9:
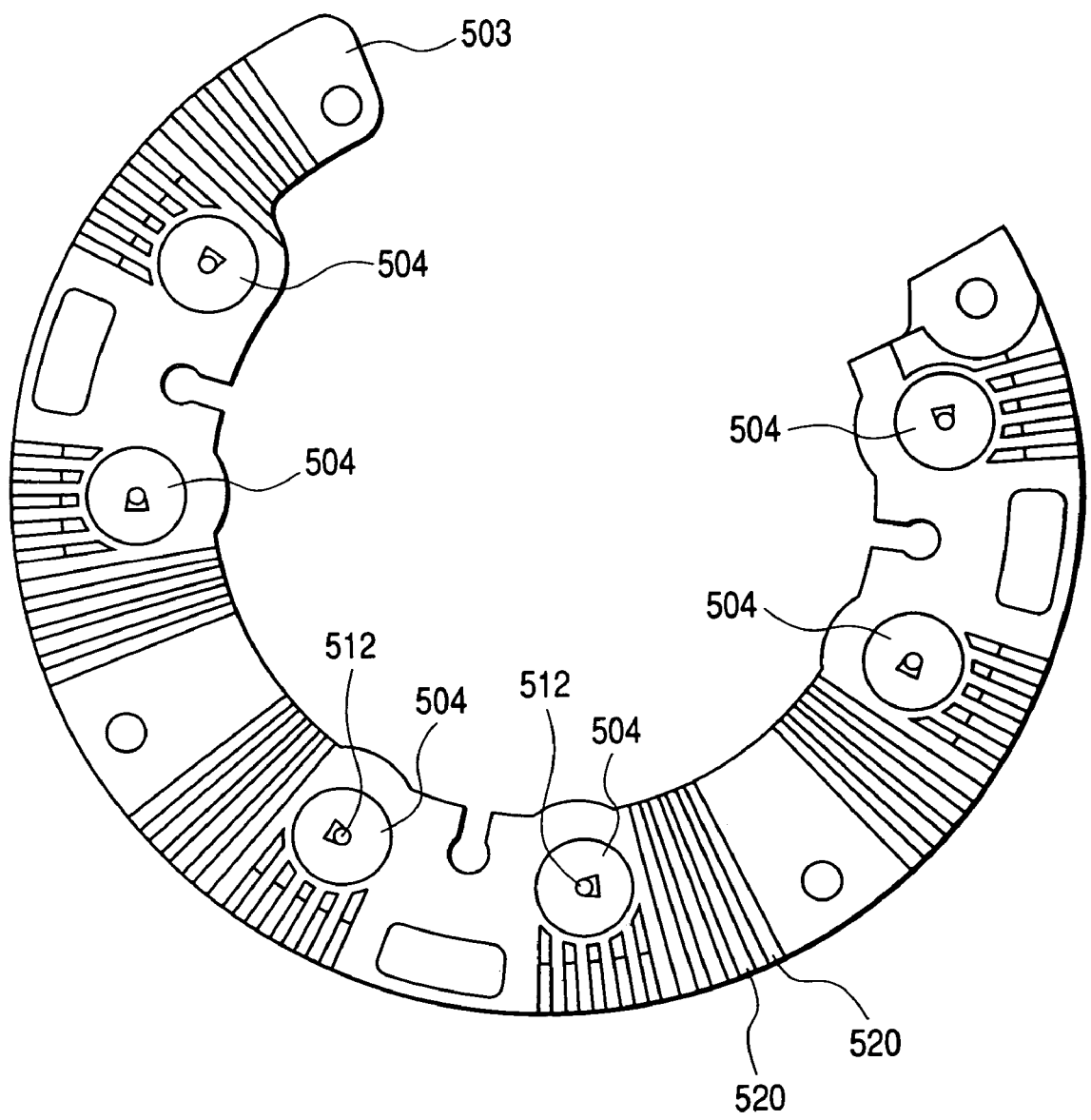
FIG. 9 is a plan view showing a negative electrode side radiating fin included in the rectifier according to the embodiment.
Figure 10:
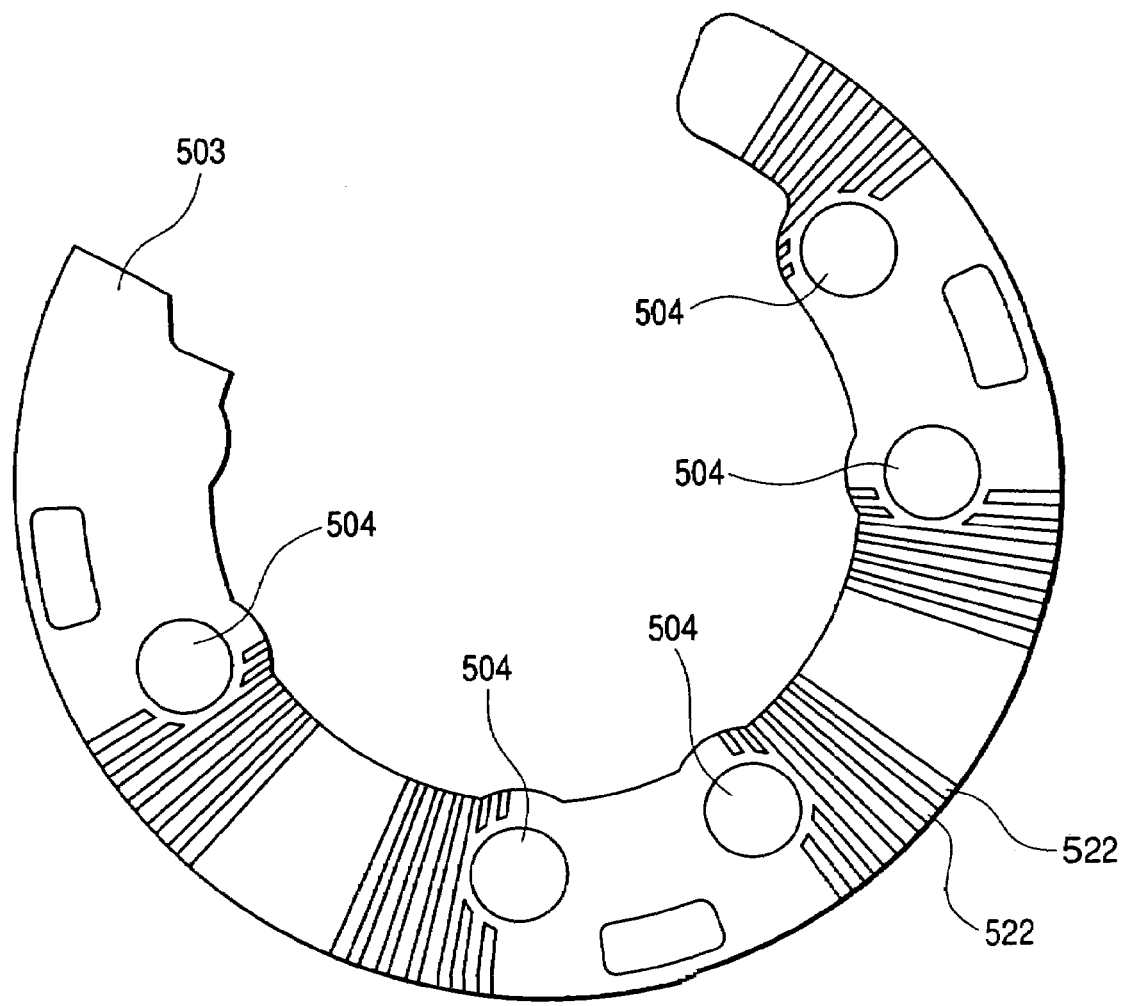
FIG. 10 is a bottom view showing the negative electrode side radiating fin according to the embodiment.
Figure 11:
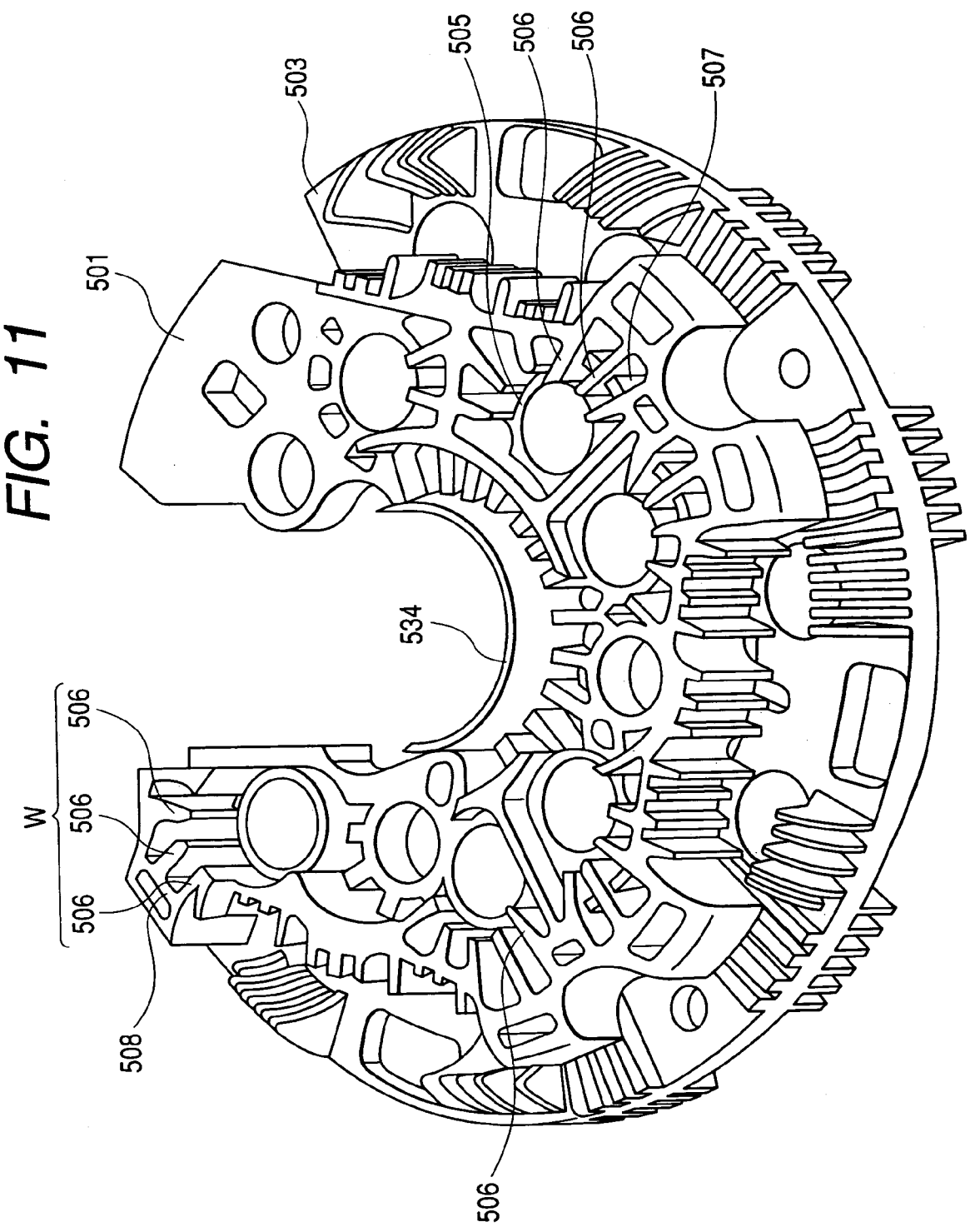
FIG. 11 is a perspective view showing the positive electrode side radiating fin and the negative electrode side radiating fin in a state stacked according to the embodiment.

Secondly, a detailed description will be given hereinbelow of the rectifier 5. FIG. 2 is a plan view showing the rectifier 5, FIG. 3 is a partial cross-sectional illustration of the vehicle AC generator 1, showing a cross-sectional construction of the rectifier 5, FIG. 4 is a plan view showing a positive electrode side radiating fin included in the rectifier 5, and FIG. 5 is a bottom showing the positive electrode side radiating fin. Moreover, FIG. 6 us an enlarged cross-sectional view taken along a line VI—VI of FIG. 4, FIG. 7 is an enlarged cross-sectional view taken along a line VII—VII of FIG. 4 and FIG. 8 is an partial enlarged view showing a radiating fin fixing portion and radial sub-fin shown in FIG. 4. Still moreover, FIG. 9 is a plan view showing a negative electrode side radiating fin included in the rectifier 5, FIG. 10 is a bottom view showing the negative electrode side radiating fin, and FIG. 11 is a perspective view showing a state in which the positive electrode side radiating fin and the negative electrode side radiating fin are in piles, where parts other than the respective radiating fins are omitted from the illustration.

The rectifier 5 includes horseshoe-like positive electrode side radiating fin 501 and negative electrode side radiating fin 503 stacked in a double structure in an axial direction, a positive electrode side rectifying element 502 attached to the positive electrode side radiating fin 501, a negative electrode side rectifying element 504 attached to the negative electrode side radiating fin 503, a terminal board 513.

The terminal board 513 is a resin-made insulating member for making the electrical insulation between the positive electrode side radiating fin 501 and the negative electrode side radiating fin 503, and contains an electrical conductive member 514 for leading an alternating-current voltage generated in the stator 4 to the positive electrode side rectifying element 502 and the negative electrode side rectifying element 504. The positive electrode side rectifying element 502 is disposed so that a lead portion 510 confronts the negative electrode side radiating fin 503, while the negative electrode side rectifying element 504 is disposed so that a lead portion 512 is in opposed relation to the positive electrode side radiating fin 501. The lead portion 512 of the negative electrode side rectifying element 504 is set so that the joining position (unction) with the electrical conductive member 514 is located on the downstream side along the flow of the cooling wind with respect to a cooling wind suction side end surface position of the positive electrode side radiating fin 501, that is, so that the tip portion of the lead portion 512 is positioned on the rotor 2 side with respect to a rear side end surface of the positive electrode side radiating fin 501. In most cases the vehicle AC generator 1 is mounted in a vehicle so that a rotary shaft 21 of the rotor 2 is placed into a horizontal condition and, in such cases, even if an electrolyte or the like flows through a surface of the positive electrode side radiating fin 501 due to the reception (dash) of water, it is possible to prevent the lead portion 512 of the negative electrode side rectifying element 504 from being directly exposed to the electrolyte, which enables reducing the occurrence of corrosion due to the electrolyte, thereby improving the environmental resistance. Moreover, this can eliminate the need for the employment of a waterwall which is for preventing the electrolyte from sticking directly to the lead portion 512, which leads to the cost reduction through structural simplification.

Each of these positive electrode side rectifying element 502 and negative electrode side rectifying element 504 is driven into a press-in hole made in the positive electrode side radiating fin 501 or the negative electrode side radiating fin 503, and each of the lead portions 510 and 512 is electrically connected to the electrical conductive member 514 on the terminal board 513 to establish a full-wave rectification circuit. For example, in this embodiment, for forming two sets of three-phase full-wave rectification circuits, as shown in FIG. 2, six positive electrode side rectifying elements 502 and six negative electrode side rectifying elements 504 are provided in the positive electrode side radiating fin 501 and the negative electrode side radiating fin 503, respectively.

In addition, a bolt 500 serving as an output terminal is fitted to one end portion of the positive electrode side radiating fin 501, and a direct-current output is fetched through is bolt 500.

The rectifier 5 having the above-described construction is located between the rear frame 3b and the protective cover 8 and, together with the protective cover 8, is fastened and fixed to a fastening bolt 31 acting as a supporting member for a rear bearing box 30. Moreover, the negative electrode side radiating fin 503 is set to be larger in outer-diameter dimension than the positive electrode side radiating fin 501, and each of the negative electrode side rectifying elements 504 is located on the more outer diameter side with respect to each of the positive electrode side rectifying elements 502.

Still additionally, as shown in FIG. 3, the negative electrode side radiating fin 503 is brought into contact with the rear frame around the fastening bolt 31 and, places other than it, an air flow groove 810 communicating from a radial opening portion 802 between the protective over 8 and the rear frame 3b to an air inlet 803 of the rear frame 3b is made, at least between the driving portion of the negative electrode side rectifying element 504 and the rear frame 3b. Moreover, in the protective cover 8, an axial opening portion 801 is made in the vicinity of the positive electrode side rectifying element 502.

In this embodiment, the positive electrode side radiating fin 501 and the negative electrode side radiating fin 503 is constructed by means of, for example, aluminum die-casting, which improves the quantity production to achieve the cost reduction. Incidentally, it is also appropriate that a metallic material such as aluminum material, copper material or the like, which has a high heat conductivity, is cut to form these radiating fins.

The positive electrode side radiating fin 501 is equipped with six cylindrical fixing portions 505 serving as press-in holes, to which the positive electrode side rectifying elements 502 are fixedly secured, radial sub-fins (first sub-fins) 506 extending radially from the respective fixing portions 505, and arc-like sub-fins (second sub-fins) 507 for connecting the adjacent radial sub-fins 506 in an arc-like configuration. Axial, air flow passages 509 are formed by opening portions surrounded by the fixing portions 505, the radial sub-fins 506 and an outer circumferential end portion 508 of the positive electrode side radiating fin 501. Moreover, each of the arc-like sub-fins 507 is disposed concentrically with respect to the axis (central axis) of each of the positive electrode side rectifying elements 502, and the opening portions forming the axial air low passages 509 are placed into a divided condition by the arc-like sub-fins 507. Still moreover, the arc-like sub-fins 507 are formed on the sore outer diameter side (side closer to the outer diameter) than (with respect to) the fixing positions of the positive electrode side rectifying element 502 when reference is made to the rotary shaft 21 of the rotor 2.

Figure 6:
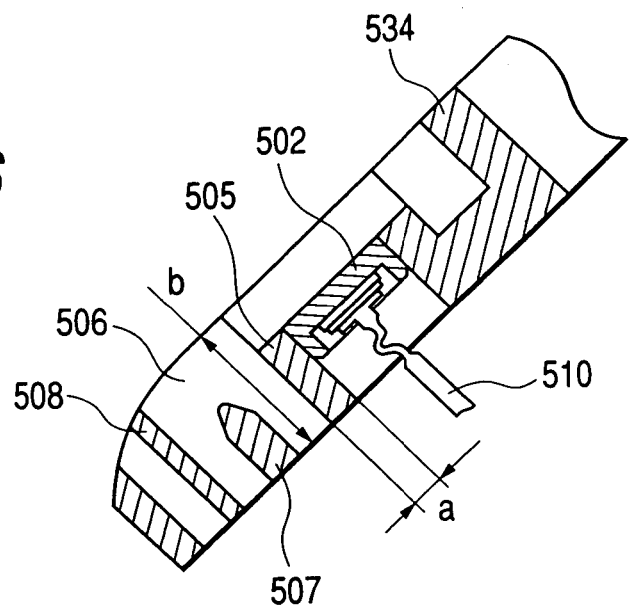
FIG. 6 is a enlarged cross-sectional view taken along a line VI—VI in FIG. 4.

As FIG. 6 shows, the length of the arc-like sub-fin 507 along (in a direction of) the rotary shaft 21 of the rotor 2 is shorter than the length of the radial sub-fin 506 along the rotary shaft 21 thereof, and its cooling wind suction side end portion is set to be in a further recessed condition toward the cooling fan 26 side of the rotor 2 as compared with the suction side end portion of the radial sub-fin 506. The thickness a of the fixing portion 505 in its radial direction is set to be smaller than the thickness b of the radial sub-fin 506 along the axis of the positive electrode side rectifying element 502 (in an axial direction thereof). The cooling wind suction side end portion of the radial sub-fin 506 further protrudes toward the cooling wind suction side with respect to the cooling wind suction side end portion of the fixing portion 505 or the cooling wind suction side end portion of the positive electrode side rectifying element 502 fixed to this fixing portion 505. Moreover, a standing portion 534 protruding toward the cooling wind suction side with respect to the cooling wind suction side end portion of the fixing portion 505 is formed at an inner-circumferential end portion of the radiating fin 501.

As FIG. 7 shows, the radial sub-fin 506 is made such that its side surface is inclined to reduce the opening area of the axial air flow passage 509 along the flow of the cooling wind. The above-mentioned radial sub-fins 506 and arc-like sub-fins 507 are formed integrally with the positive electrode side radiating fin 501 constructed by means of the aluminum die-casting.

Furthermore, as FIG. 8 shows, the radial sub-fin 506 has a first wall surface 530 located on the outer-diameter side around the positive electrode side rectifying element 502 and a second wall surface 532 located on the inner-diameter side to make an angle below 180 degrees with respect to the first wall surface 530. Thus, the radial sub-fin 506 has a tapered configuration toward the inner-diameter side in the vicinity of the fixing portion 505, and an air flow passage is secured as indicated by the hatching in FIG. 8.

Still furthermore, as mentioned above, the bolt 500 is attached as the output terminal to one end portion of the positive electrode side radiating fin 501. In general, the temperature of one end side of the positive electrode side radiating fin 501 having the output terminal decreases because the heat is transmitted to this output terminal, while the other end side temperature becomes high. According to this embodiment, in the positive electrode side radiating fin 501, as shown in FIG. 11, the thicknesses of the radial sub-fin 506 (in FIG. 11, a range indicated by W) corresponding to the rectifying element disposed on the other end side and the outer-circumferential end portion 508 subsequent thereto, along the axis of the rectifying element, arm set to be larger than that of the radial sub-fins 506 corresponding to the other rectifying elements. Accordingly, the other end side temperature decreases because of an increase in heat capacity, and the temperature distribution of the positive electrode side radiating fin 501 along the circumferential direction approaches a uniform condition.

The negative electrode side radiating fin 503 is formed into a generally flat-plate condition, and the negative electrode side rectifying elements 504 are respectively fixed in the six press-in holes by means of the driving. Moreover, radial protruding portions (projections) 520 are partially formed on a surface (surface opposite to the rear frame 3b) of the negative electrode side radiating fin 503 so that the cooling wind passing through the axial air flow passages 509 made in the positive electrode side radiating fin 501 flows along these protruding portions 520. Likewise, radial protruding portions 522 are partially formed on a rear surface of the negative electrode side radiating fin 503. Owing to the formation of these protruding portions 522, the cooling wind flows from the radial opening portion 802 between the protective cover 8 and the rear frame 3b through the air flow groove 810 communicating with the air inlet 803 of the rear frame 3b, thereby achieving the efficient cooling of the negative electrode side radiating fin 503.

As described above, in the positive electrode side radiating fin 501 of the rectifier 5 according to this embodiment, since the radial sub-fins 506 are formed radially from the fixing portions 505 for the positive electrode side rectifying elements 502, the heat generated from the positive electrode side rectifying elements 502 can efficiently be transmitted though the radial sub-fins 506 without staying in the vicinity of the positive electrode side rectifying elements 502, and the cooling wind passes through the opening portion surrounded by the fixing portions and the radial sub-fins 506, so it is possible to directly cool with the cooling wind, the fixing portions 505 and the radial sub-fins 506 where their temperatures become high, which leads to improving the cooling capability of the rectifier 5 considerably. Moreover, the opening portions arm formed around the fixing portions 505 for fixing the positive electrode side rectifying elements 502 and, hence, in the positive electrode side radiating fin 501, vibrations become hard to transmit from the periphery to the fixing portions 505, thus reducing the occurrence of disconnection of the lead portions 510 of the positive electrode side rectifying elements 502.

In addition, since the thickness a of the fixing portion 505 in its radial direction is made to be thinner than the thickness b of the radial sub-fin 506 along the axis of the positive electrode side rectifying element 502, it is possible to efficiently cool, with the cooling wind, the outer circumferential portion of the fixing portion 505 which is in the vicinity of the positive electrode side rectifying element 502 acting as a heat generating portion and which reaches a high temperature.

Still additionally, since the cooling wind suction side end portion of the radial sub-fin 506 is placed into a further protruded condition toward the cooling wind suction side with respect to the cooling wind suction side end portion of the fixing portion 505 or the cooling wind suction side end portion of the positive electrode side redwing element 502 fixed to the fixing portion 505, the cooling wind hitting the positive electrode side rectifying element 502 can smoothly be introduced into the opening portion, and the improvement of the cooling capability becomes feasible owing to an increase in rating area and heat capacity which tom place by prolonging the axial length of the radial sub-fin 506.

Yet additionally, since the radial sub-fin 506 has the first wall surface 530 located on the outer-diameter side around the positive electrode side rectifying element 502 and the second wall surface 532 located on the inner-diameter side to make an angle below 180 degrees with respect to the first wall surface 530, it is possible to secure an air flow passage in the vicinity of the inner diameter end portions of the two radial sub-fins 506 adjacent to each other in a state formed radially. In particular, this enables efficiently cooling this vicinity of the inner-diameter end portions whose temperatures become high, and enables increasing the quantity of the cooling wind flowing into the opening portion.

Moreover, since the standing portion 534 further protruding toward the cooling wind suction side with respect to the cooling wind suction side end portion of the fixing portion 505 is formed at an inner-circumferential end portion of the positive electrode side radiating fin 501, the cooling wind sucked to the vicinity of the center of the positive electrode side radiating fin 501 can be led to the vicinity of the positive electrode side rectifying element 502, thereby achieving the efficient cooling. In addition, in a case in which a difference in temperate appears along a circumferential direction of the positive electrode side radiating fin 501, for example, when the temperature of an end portion on the side isolated from the output terminal becomes high in the positive electrode side radiating fin 501, the heat is transmitted through this standing portion 534, thus uniformizing the temperature distribution along the circumferential direction of the positive electrode side radiating fin 501.

Still moreover, since the radial sub-fins 506 and the opening portions are formed with respect to the positive electrode side radiating fin 501 located on the upstream side along the flow of the cooling wind and the plurality of protruding portions 520 are formed at the positions on the negative electrode side radiating fin 503 corresponding to the opening portions, the cooling wind passing through the opening portions of the positive electrode side radiating fin 501 can directly be applied to the protruding portions 520 of the negative electrode side radiating fin 503, thus enabling efficiently cooling the negative electrode side radiating fin 503 and the entire rectifier 5.

Yet moreover, since these protruding portions 520 are formed radially around the rotary shaft 21 of the rotor 2, the cooling wind arriving at the negative electrode side radiating fin 503 can smoothly be led to the outer-diameter side to improve the cooling capability owing to the reduction of the air flow resistance.

In addition, the bolt 500 serving as an output terminal is provided at one end portion of the positive electrode side radiating fin 501 along its circumferential direction, and the thickness of the radial sub-fin 506 along the axis of the positive electrode side rectifying element 502, corresponding to the rectifying elements located on the other end side along the circumferential direction, is set to be larger than the thickness of the radial sub-fins 506 corresponding to the other positive electrode side rectifying element 502. In general, the temperature of one end side of the positive electrode side radiating fin 501 at which the output terminal exists becomes lower than the other end side temperature because the heat is transmitted to the output terminal. Therefore, the axial thickness of the radial sub-fin provided on the other end side where the temperature is high is set to be larger to lower the temperature, which enables the uneven circumferential direction temperature distribution of the positive electrode side radiating fin 501 to be brought close to an even condition, thus enhancing the cooling capability of the entire positive electrode side radiating fin 501.

Furthermore, as described above, in the positive electrode side radiating fin 501 of the rectifier 5 according to this embodiment, since the radial sub-fins 506 and the arc-like sub-fins 507 are formed around the fixing portions 505 for the fixing of the positive electrode side rectifying elements 502, when the cooling wind introduced through the axial opening portion 801 by means of the cooling fan 26 of the rotor 2 passes through the axial air flow passage 509 and led to the air inlet 803, the air flow resistance decreases to secure the wind quantity, and the cooling wind is directly applied to the fixing portions 505 close to the heat generating portions for the heat radiation, thereby improving the cooling capability. Moreover, in the positive electrode side radiating fin 501, a predetermined length is secured along the flow of the cooling wind without employing the flat-plate condition to enhance the surface areas of the radial sub-fins 506 and the arc-like suborns 507, which enables enlarging the heat radiating areas and improving the cooling capability. Still moreover, since the arc-like sub-fin 507 is used as a reinforcing member by crossing the opening portion made in the vicinity of the fixing portion 505, it is possible to improve the vibration proof of the positive electrode side radiating fin 501 and the rectifier 5 using this.

Still furthermore, a side surface of the radial sub-fin 506 forming the opening portion of the axial air flow passage 509 is inclined to reduce the opening area along the flow of the sucked cooling wind so that the area of the inner wall surface of the opening portion is enlargeable to improve the cooling capability owing to the enlargement of the heat radiating area. Moreover, when the cooling wind passes through the interior of the opening portion, since the opening area decreases gradually, the flow velocity of the cooling wind increases gradually, thus raising the efficiency of heat radiation from the inner wall surface of the opening portion.

Yet furthermore, since the arc-like sub-fin 507 is formed concentrically with respect to the axis of the positive electrode side rectifying element to make a connection between the two adjacent radial sub-fins 506, the improvement of the vibration resistance is feasible, and since the arc-like sub-din 507 is disposed in the axial air flow passage 509, the heat radiating area increases, which enables the enhancement of the cooling capability.

In addition, the arc-like 507 is formed on the more outer diameter side than the fixing position of the positive electrode side rectifying element 502 with respect to the rotary shaft 21 of the rotor 2, and as compared with the formation thereof on the inner diameter side, the heat radiating area comes enlargeable.

Still additionally, since the axial length (length in the direction of the rotary shaft 21 of the rotor 2) of the arc-like sub-fin 507 is set to be shorter than the axial direction of the radial sub-fin 506 and the cooling wind suction side end portion of the arc-like sub-fin 507 is formed on the cooling fan 26 side with respect to (than) the suction side end portion of the radial sub-fin 506, it is possible to form the arc-like sub-fin 507 without reducing the cooling wind suction side opening area, which leads to improving the cooling capability and the vibration proof.

It should be understood that the present invention is not limited to the above-described embodiment, and that it is intended to cover all changes and modifications of the embodiment of the invention herein which do not constitute departures from the spirit and scope of the invention.

For example, although in the above-described embodiment the radial sub-fins 506 are formed with respect to only the positive elide side radiating fin 501 and the negative electrode side radiating fin 503 is formed into a generally flat-plate configuration in which protruding portions 520 and 522 are partially formed on it surface, it is also appropriate that, as well as the positive electrode side radiating fin 501, radial sub-fins 506 are also provided in the negative electrode side radiating fin 503 side. This can further reduce the air flow resistance when the cooling wind passes through the rectifier 5.

In addition, although in the above-described embodiment the negative electrode side radiating fin 503 is located on the side close to the rear frame 3b, it is also acceptable that, conversely, the positive electrode side radiating fin is provided on the side close to the rear frame 3b. In this case, the negative electrode side radiating fin located on the upstream side along the flow of the cooling wind may be made to have the construction shown in FIGS. 5 and 6. Moreover, it is also possible that the positive electrode side radiating fin 501 and the negative electrode side radiating fin 503 are arranged side by side instead of they being disposed in a state piled up in the direction of the rotary shaft 21. In this case, both the radiating fins may be equipped with the radial sub-fins 506 and the arc-like sub-fins 507.

Still additionally, although in the above-described embodiment the rectifier 5 is designed to establish two sets of three-phase full-wave rectification circuits, when the present invention is applied to a common rectifier including one set of three-phase full-wave rectification circuit or a rectifier including three or more sets of three-phase full-wave rectification circuits, the like effects are also obtainable.

Yet additionally, although in the above-described embodiment the protective cover 8 is made of a resin, it is also possible to employ a metal-made protective cover. In this case, the cover itself functions as a radiating fin to promote the heat transmission from the rectifier 5, thus improving the cooling capability.

Figure 12:
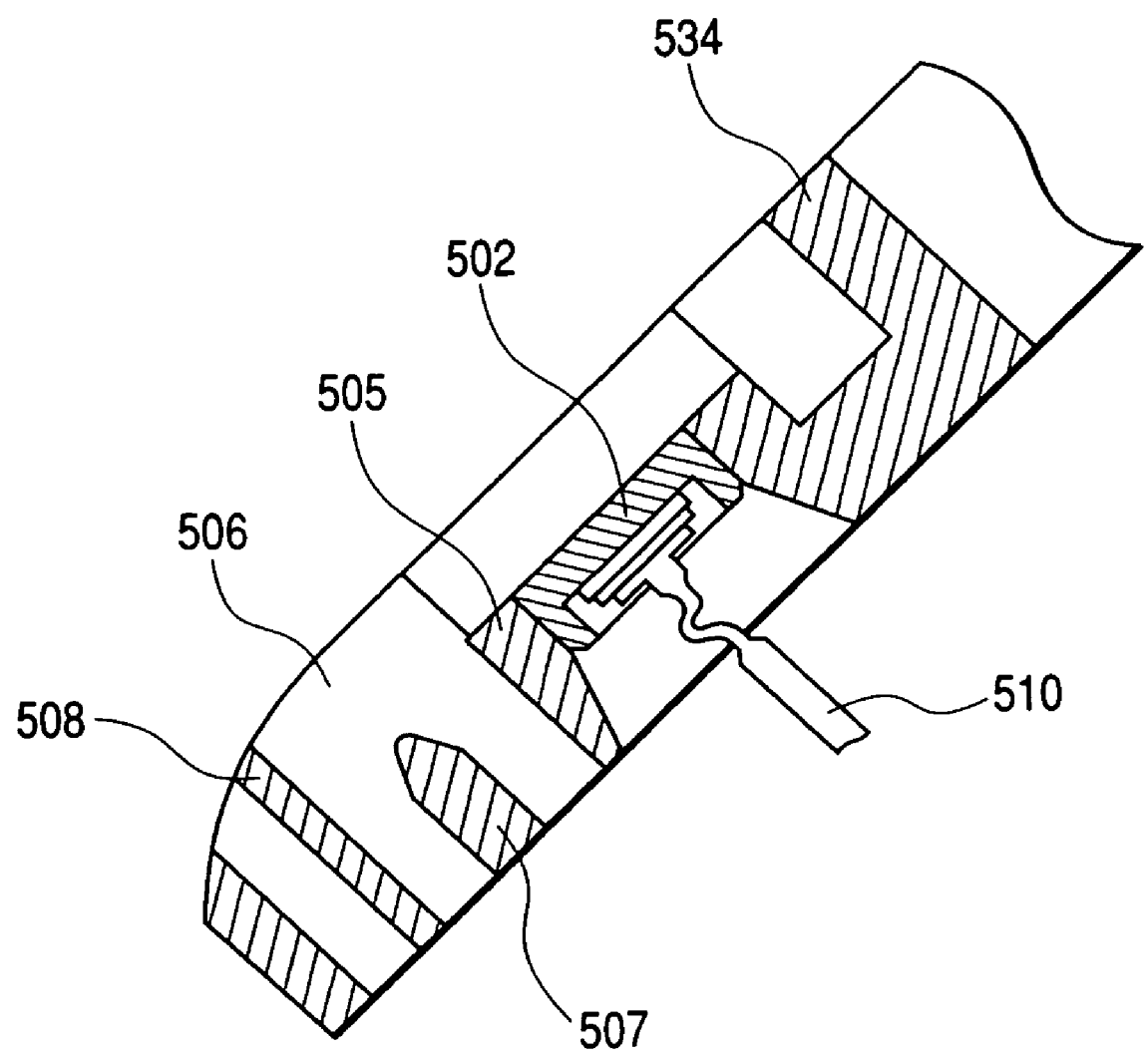
FIG. 12 is a partial cross-sectional view showing a modification of the radiating fin according to the embodiment.

Moreover, in the above-described embodiment, it is also appropriate that a rectifying element driving inner circumferential surface (inner-circumferential surface of the fixing portion 505) of the radiating fin is formed into a tapered configuration as shown in FIG. 12. This can prevent the foreign matters from staying in the vicinity of the rectifying elements at the mounting in a vehicle.

Still moreover, although in the above-described embodiment the radial sub-fins 506 and the arc-like sub-fins 507 are formed in only the positive electrode side radiating fin 501 and the negative electrode side radiating fin 503 is formed into a generally flat-plate configuration in which partial protruding portions 520 are formed on its surface, it is also appropriate that, as well as the positive electrode side radiating fin 501, the negative electrode side radiating fin 503 side is equipped with the radial sub-fins 506 and the arc-like sub-fins 507. In this case, the air flow resistance is further reducible when the cooling wind passes through the rectifier 5.

What is claimed is:

1. An AC generator for a vehicle, comprising:
   a rotor;
   a stator disposed in opposed relation to said rotor;
   a frame for supporting said rotor and said stator;
   a rectifier fixedly secured to said frame and equipped with a radiating fin which cools a rectifying element and makes an electrical connection; and
   a cooling wind generating device for sucking cooling wind through said rectifier into the rotor side,
   wherein said radiating fin comprises:
   a fixing portion to which said rectifying element is fixedly secured;
   a first sub-fin extending radially from said fixing portion toward an outer circumferential end portion of said radiating fin observed from a position of said rectifying element; and
   a second sub-fin, having an arc-like configuration formed concentrically with the axis of said rectifying element, made to divide an air passage surrounded by said fixing portion, said first sub-fin and the outer circumferential end portion of said radiating fin, and the first sub-fin traverses the air passage and the second sub-fin.

2. The generator according to claim 1, wherein at least one side surface forming said air passage is made to be inclined to reduce an opening area along a flow of the cooling wind to be sucked.

3. The generator according to claim 1, wherein said second sub-fin is located on a more outer diameter side with respect to said fixed position of said rectifying element around said rotary shaft of said rotor.

4. The generator according to claim 1, wherein a length of said second sub-fin along a direction of a rotary shaft of said rotor is set to be shorter than length of said first sub-fin in the rotary shaft direction, and a cooling wind suction side end portion of said second sub-fin is located on a cooling wind generating device side with respect to a suction side end portion of said first sub-fin.

5. The generator according to claim 1, wherein said radiating fin includes, as two types of radiating fins, a positive electrode side radiating fin and a negative electrode side radiating fin which are disposed in piles in a direction of a rotary shaft of said rotor, and at least said radiating fin disposed on the upstream side along a flow of the cooling wind has said first and second sub-fins.

* * * * *